United States Patent
Kim et al.

(10) Patent No.: US 10,714,662 B2
(45) Date of Patent: Jul. 14, 2020

(54) PHOSPHOR PLATE AND METHOD FOR MANUFACTURING THE SAME

(71) Applicant: LG INNOTEK CO., LTD., Seoul (KR)

(72) Inventors: Won Jin Kim, Seoul (KR); Jin Gyeong Park, Seoul (KR); Ju Yeon Won, Seoul (KR); In Jae Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 127 days.

(21) Appl. No.: 15/505,514

(22) PCT Filed: Aug. 20, 2015

(86) PCT No.: PCT/KR2015/008719
§ 371 (c)(1),
(2) Date: Feb. 21, 2017

(87) PCT Pub. No.: WO2016/028105
PCT Pub. Date: Feb. 25, 2016

(65) Prior Publication Data
US 2017/0271564 A1    Sep. 21, 2017

(30) Foreign Application Priority Data

Aug. 21, 2014  (KR) ......................... 10-2014-0108748

(51) Int. Cl.
*H01L 33/50* (2010.01)
*C03C 14/00* (2006.01)
(Continued)

(52) U.S. Cl.
CPC .......... *H01L 33/505* (2013.01); *C03C 14/004* (2013.01); *C03C 14/006* (2013.01);
(Continued)

(58) Field of Classification Search
CPC ... H01L 33/504; H01L 33/505; C09K 11/025; C09K 11/0883; C09K 11/646; C09K 11/7774; C03C 14/004
(Continued)

(56) References Cited

U.S. PATENT DOCUMENTS

| 2009/0039365 A1 | 2/2009 | Andrews et al. |
| 2013/0163225 A1* | 6/2013 | Nakatsu ............... G03B 21/204 |
| | | 362/84 |
| 2013/0228800 A1 | 9/2013 | Lessard et al. |

FOREIGN PATENT DOCUMENTS

| JP | 2005011933 A | 1/2005 |
| JP | 2010-157637 A | 7/2010 |

(Continued)

OTHER PUBLICATIONS

JP 2013-219123 A—Machine Translation.*
(Continued)

*Primary Examiner* — Marvin Payen
(74) *Attorney, Agent, or Firm* — Saliwanchik, Lloyd & Eisenschenk

(57) ABSTRACT

The present invention relates to a phosphor plate comprising: a base plate; and phosphor included in the base plate, and provides a phosphor plate and a method for manufacturing the same, wherein one side of the phosphor plate comprises: a protrusion part formed by protrusion of the phosphor fixed to the base plate; and a recess part formed by separation of the phosphor from the base plate, the protrusion part being 20 to 70% with respect to the area of one side of the phosphor plate.

10 Claims, 4 Drawing Sheets

(51) Int. Cl.
*C09K 11/02* (2006.01)
*C09K 11/08* (2006.01)
*C09K 11/64* (2006.01)
*C09K 11/77* (2006.01)
*H01L 51/52* (2006.01)

(52) U.S. Cl.
CPC ........ *C09K 11/025* (2013.01); *C09K 11/0883* (2013.01); *C09K 11/646* (2013.01); *C09K 11/7774* (2013.01); *H01L 33/504* (2013.01); *C03C 2214/04* (2013.01); *C03C 2214/16* (2013.01); *H01L 33/501* (2013.01); *H01L 51/5268* (2013.01); *H01L 2933/0041* (2013.01); *H01L 2933/0091* (2013.01)

(58) Field of Classification Search
USPC .......................................... 257/98, 100–102
See application file for complete search history.

(56) References Cited

FOREIGN PATENT DOCUMENTS

| | | | |
|---|---|---|---|
| JP | 2010-219163 A | | 9/2010 |
| JP | 2013219123 A | * | 10/2013 |
| JP | 2013219123 A | | 10/2013 |
| KR | 1020050064454 A | | 6/2005 |
| KR | 1020140057932 A | | 5/2014 |

OTHER PUBLICATIONS

Supplementary European Search Report dated Apr. 18, 2017 in European Application No. 15833201.5.
International Search Report in International Application No. PCT/KR2015/008719, filed Aug. 20, 2015.

* cited by examiner

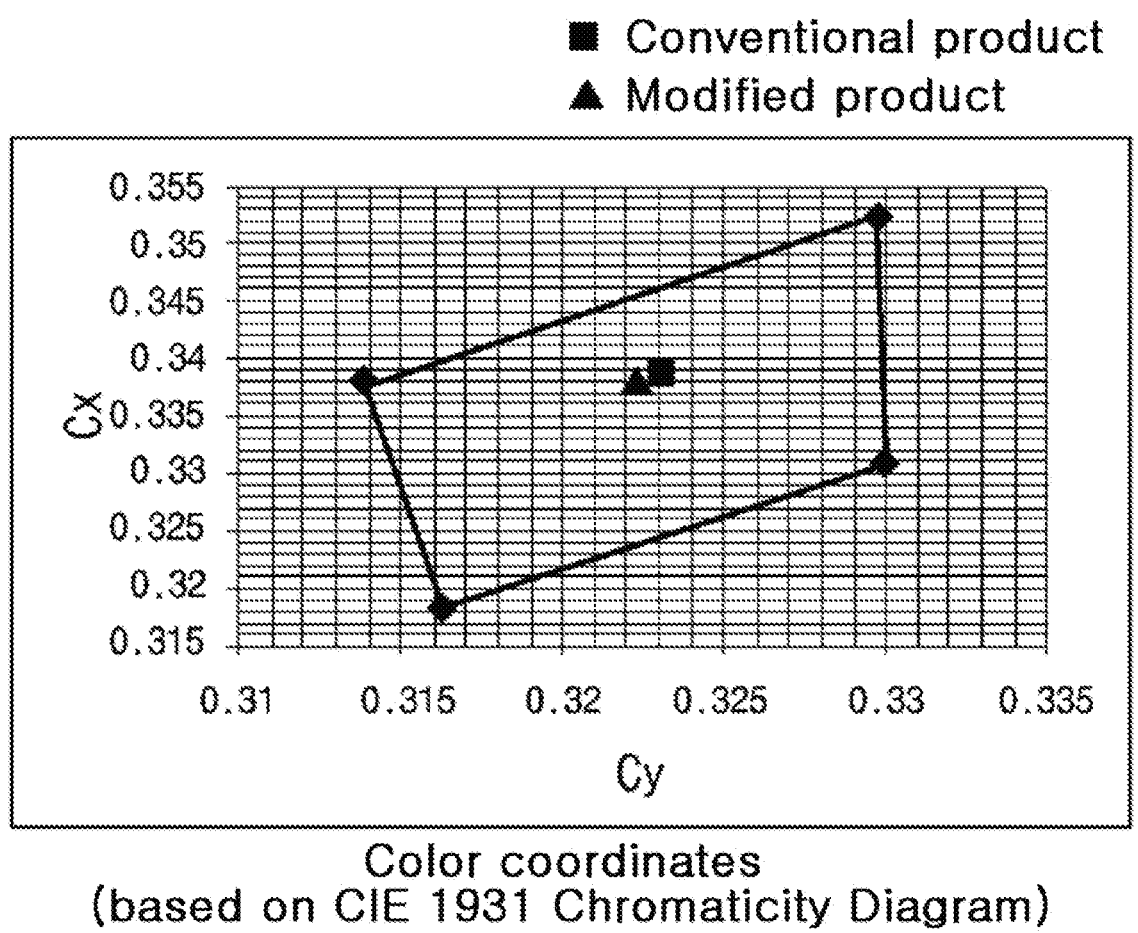

PHOSPHOR PLATE AND METHOD FOR MANUFACTURING THE SAME

CROSS-REFERENCE TO RELATED APPLICATIONS

This application is the U.S. national stage application of International Patent Application No. PCT/KR2015/008719, filed Aug. 20, 2015, which claims priority to Korean Application No. 10-2014-0108748, filed Aug. 21, 2014, the disclosures of each of which are incorporated herein by reference in their entirety.

TECHNICAL FIELD

Embodiments of the present invention relate to a phosphor plate and a method for manufacturing the same.

BACKGROUND ART

A phosphor plate for light emitting diodes (LEDs) is manufactured using glass frit and a phosphor. The phosphor plate has a complex structure in which an inorganic crystal-based phosphor is distributed in a glass matrix. When a phosphor plate is manufactured by sintering glass frit, structural defects such as pore formation occur. Such structural defects result in lower strength of the phosphor plate. The structural defects cause destruction or damage to LEDs since LEDs are subjected to physical damage during subsequent processes such as abrasive polishing, dicing, and packaging processes and also when LEDs are driven for a long period of time.

For example, the phosphor included in the phosphor plate may be damaged or separated when the phosphor plate is subjected to abrasive polishing. When the phosphor is damaged, the luminous flux of the phosphor plate may decline, the luminous efficiency may be lowered, or color qualities such as color homogeneity in the phosphor plate may be degraded. When the phosphor is separated from the phosphor plate, a content of the phosphor in the phosphor plate may be reduced, resulting in decreased luminous flux and degraded color quality.

DISCLOSURE

Technical Problem

The present invention is directed to providing a phosphor plate capable of reducing the separation and loss of a phosphor from a phosphor plate and a method for manufacturing the same.

Also, technical problems to be solved by the present invention are not limited to the technical problems as described above, and other technical problems not disclosed herein will be clearly understood from the following description by those skilled in the art to which the present invention belongs.

Technical Solution

To solve the above problems, one aspect of the present invention provides a phosphor plate, which includes a base plate having one side and the one side opposite to the other side thereof; a phosphor included in the base plate; and a protrusion part formed so that a portion of the phosphor is exposed at the one side or the other side of the base plate.

Here, the protrusion part accounts for 20% to 70% of the total surface area of the one side or the other side of the base plate.

Advantageous Effects

According to the present invention, a phosphor plate and a method for manufacturing the same can be provided. Here, since a phosphor may be preserved without being damaged or separated from a base plate even when the phosphor undergoes a polishing process, the phosphor can account for 20 to 70% of the area of one side of a base plate.

DESCRIPTION OF DRAWINGS

FIG. 5 is a graph in which the phosphor plate according to one exemplary embodiment of the present invention is compared with the conventional phosphor plate.

BEST MODE

Hereinafter, preferred embodiments of the present invention which may be easily put into practice by a person having ordinary skill in the art to which the present invention belongs will be described in detail with reference to the accompanying drawings.

Figure 1:
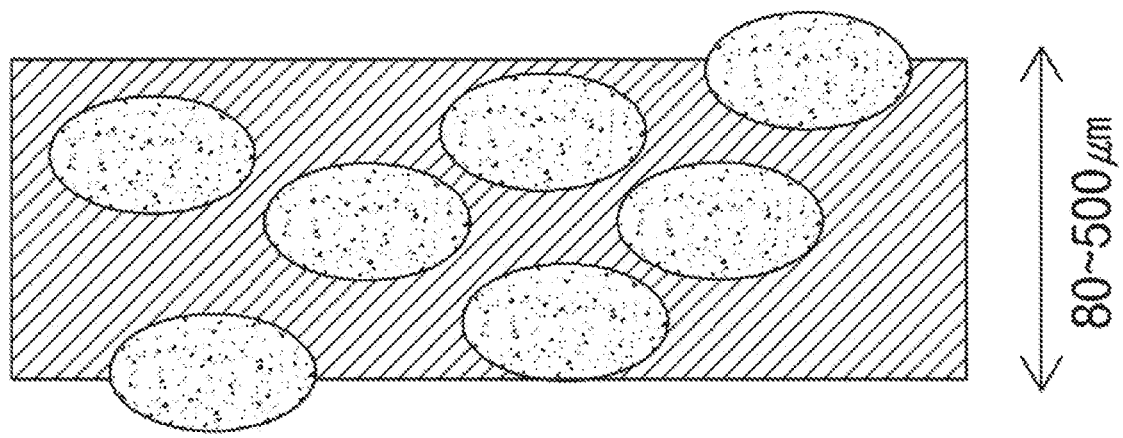
FIG. 1 is a diagram schematically showing a phosphor plate according to one exemplary embodiment of the present invention.
Figure 2:
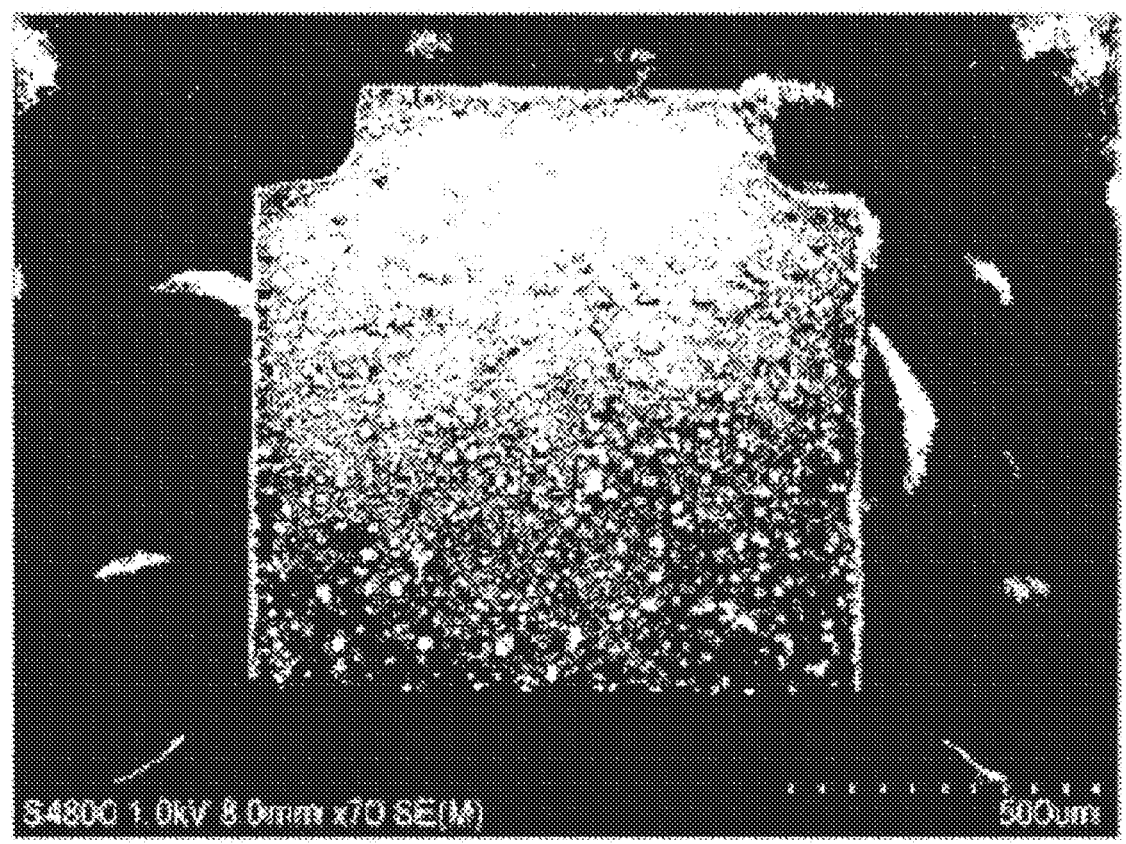
FIG. 2 is an image of one side of the phosphor plate of FIG. 1 observed under a microscope.

FIG. 1 is a diagram schematically showing a phosphor plate according to one exemplary embodiment of the present invention, FIG. 2 is an image of one surface of the phosphor plate of FIG. 1 observed under a microscope.

As shown in FIGS. 1 and 2, a phosphor plate provided according to this exemplary embodiment includes a base plate and a phosphor.

The base plate is a base that may be mixed with a phosphor so that the resulting mixture can be compression-molded into a phosphor plate.

The base plate according to this exemplary embodiment may be a glass base. In this case, the glass base serving as the base plate may be formed of glass which has high transparency and is used as optical glass. Also, as the glass base, glass frit may be generally mixed with a particle-type phosphor, and sintered to obtain a phosphor plate.

A material having a transmittance of 70% to 80% and a refractive index of 1.5 to 1.7 based on a thickness of 190 μm after glass sintering may be used as the glass material. The transmittance and refractive index of the glass material may be lowered when the glass material is mixed with the phosphor and sintered. Therefore, a material whose transmittance and refractive index are in a proper range may be chosen and used, depending on the type of phosphor. A composition of the glass material may be varied in consideration of desired optical and heat-processing characteristics of the phosphor plate and a phosphor to be mixed, and used.

Examples of the glass base serving as the base plate include borate glass or phosphate glass as well as soda lime glass, calcium lime glass, lead glass, barium glass, silica glass, and the like, all of which include silica as a main ingredient, but the present invention is not limited thereto.

For example, all types of glass materials capable of transmitting light may fall within the scope of this exemplary embodiment.

Also, the base plate according to this exemplary embodiment is not limited to the glass base, and may be a plastic base made of a transparent material. Types of transparent plastics which have high transparency and are used for optical elements may be used as the plastic substrate made of the transparent material.

Types of the transparent plastics may, for example, include polyethylene terephthalate (PET), polypropylene (PP), polymethyl methacrylate (PMMA), or polyethylene naphthalene (PEN), but the present invention is not limited thereto. For example, all types of transparent plastic materials capable of transmitting light may fall within the scope of this exemplary embodiment.

The phosphor according to this exemplary embodiment includes a material which is mixed with the base plate to give fluorescence in response to incident light from an external light source.

In this case, the phosphor according to this exemplary embodiment may be a cerium-doped lutetium aluminum garnet (LuAG:Ce) phosphor included at 10 to 20 parts by weight or a nitride ($\alpha$-SiAlON) phosphor included at 1.0 to 2.0 parts by weight, based on the total weight of the base plate.

However, the phosphor is not limited to the lutetium aluminum garnet (LuAG)-based phosphor as described above. In addition, yttrium aluminum garnet (YAG)-based, nitride-based, sulfide-based, silicate-based phosphors, or a combination thereof may be used.

In this exemplary embodiment, one side of the phosphor plate including the base plate and the phosphor includes a protrusion part and a recessed part.

The protrusion part is formed by the phosphor. More specifically, the protrusion part is formed to protrude from a surface of the phosphor plate as the phosphor is maintained intact without being separated or damaged even when the phosphor included in the base plate is subjected to surface polishing.

In this case, each of the protrusion parts may account for greater than 0% and less than 50% of the volume of each of the phosphors forming the protrusion parts. The phosphors forming the protrusion parts may be separated or damaged when the phosphors protrude to be exposed to the outside at a volume ratio of 50% or more.

The recessed part is also formed by the phosphor. In this case, the recessed part may be an empty space formed by the separation of the phosphor according to this exemplary embodiment from the base plate.

Figure 3:
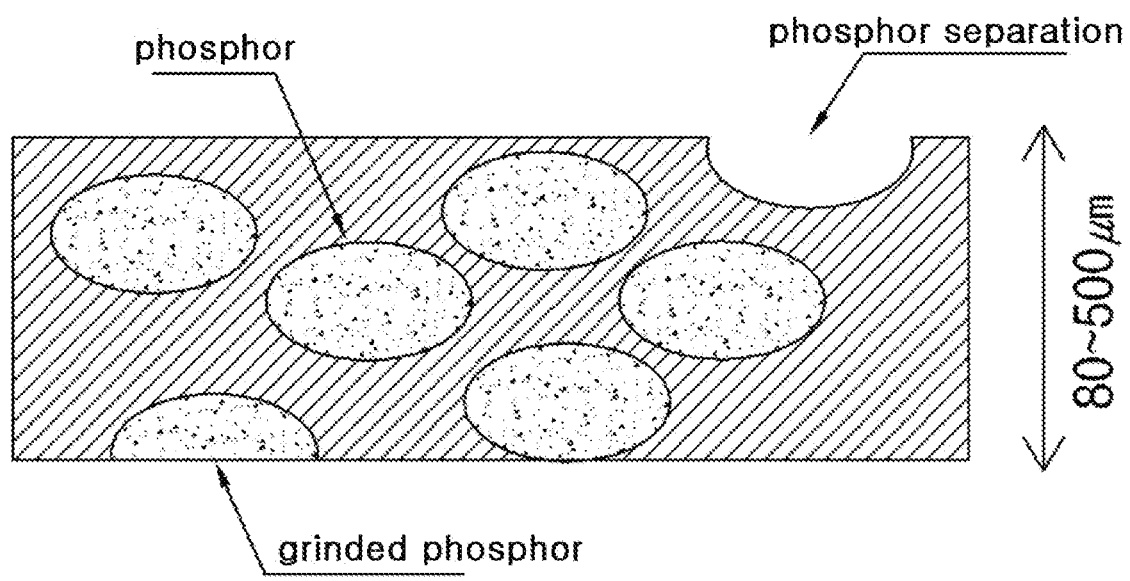
FIG. 3 is a diagram schematically showing a conventional phosphor plate.
Figure 4:
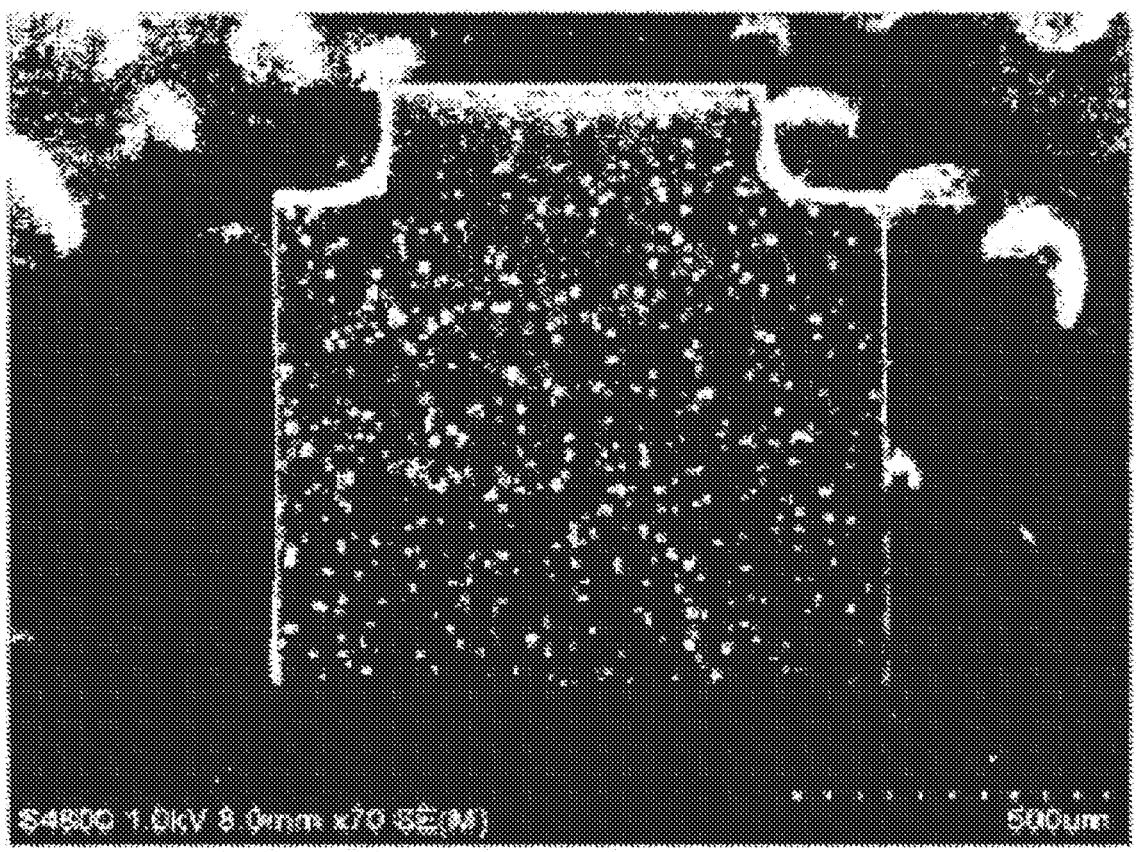
FIG. 4 is an image of one side of the phosphor plate of FIG. 3 observed under a microscope.

FIG. 3 is a diagram schematically showing a conventional phosphor plate in which a phosphor is separated or damaged due to polishing, and FIG. 4 is an image of one side of the phosphor plate of FIG. 3 observed under a microscope.

Generally, in a phosphor plate which has undergone a polishing process, a phosphor exposed at a surface of the base plate may be separated or damaged, as shown in FIGS. 3 and 4. However, in the phosphor plate according to this exemplary embodiment, a protrusion part is formed by the phosphor which is preserved without being separated or damaged, as shown in FIGS. 1 and 2.

The protrusion part according to this exemplary embodiment may account for 20% to 70% of the area of one exposed side of the phosphor plate. Therefore, the phosphor plate according to this exemplary embodiment has higher surface roughness than the phosphor plates as shown in FIGS. 3 and 4. The surface roughness will be described in further detail hereinafter.

According to this exemplary embodiment, when the protrusion part formed by the phosphor whose original shape is maintained without being separated or damaged even when the phosphor is subjected to surface polishing accounts for 20 to 70% of the area of the one side of the phosphor plate, luminous flux or luminous efficiency of the phosphor plate may be improved, and color qualities such as color homogeneity in the phosphor plate may also be improved.

Meanwhile, the surface roughness according to this exemplary embodiment may vary depending on the size of phosphor particles. For example, when a phosphor having a particle size of 25 μm or less is used, one side of the phosphor plate may have a surface roughness of 0.01 μm to 7 μm due to the protrusion part formed by the phosphor which is not separated or damaged.

Since the phosphor according to this exemplary embodiment is not separated or damaged during polishing, the phosphor may be fixed in the base plate while maintaining an original shape of the phosphor itself. Therefore, the phosphor according to this exemplary embodiment may protrude from a surface of the phosphor plate to form a protrusion part, as described above.

When such a protrusion part accounts for 20% to 70% of the area of one side of the phosphor plate, surface roughness of the phosphor plate may be improved. The surface roughness according to this exemplary embodiment may vary depending on the particle size of phosphor particles. For example, when a phosphor having a particle size of 25 μm or less is used, the phosphor plate which has been subjected to a polishing process may also have a surface roughness of 0.01 μm to 7 μm, as described above.

Meanwhile, a ratio of an area of the recessed part of the phosphor plate according to this exemplary embodiment may be greater than 0 and 5% or less with respect to the area of one exposed side of the phosphor plate.

When a surface of the phosphor plate is subjected to a polishing process, the phosphor separated from the base plate may not be completely present. However, the phosphor plate according to this exemplary embodiment is formed so that an area of the recessed part formed by the separated phosphor is a predetermined ratio or less with respect to an area of the surface of the phosphor plate.

Accordingly, a ratio of the area of the recessed part formed by the phosphor separated from the base plate according to this exemplary embodiment may be greater than 0 and less than or equal to 5% with respect to the area of one exposed side of the phosphor plate. As such, when the ratio of the area of the recessed part is greater than 0 and less than or equal to 5% with respect to the area of one side of the phosphor plate, a drop in luminous flux caused due to a decrease in the content of the phosphor in the phosphor plate may be prevented. Also, the phosphor plate according to this exemplary embodiment may have a thickness of 80 μm to 500 μm. According to this exemplary embodiment, the phosphor may be more easily fixed in the phosphor plate having a thickness of 80 μm or more, thereby ensuring a stable phosphor fixation power. Even when the base plate is subjected to a polishing process after sintering, desirable physical properties may be secured. When the phosphor plate according to this exemplary embodiment has a thickness of 500 μm or less, luminous flux may be improved, and stable color qualities such as color homogeneity may be effectively realized.

As described above, the phosphor plate according to one exemplary embodiment of the present invention has been described. Since the phosphor plate according to this exemplary embodiment includes phosphors which are not separated and damaged even after the phosphors are subjected to a polishing process, a protrusion part may be formed by such phosphors. The phosphor plate having improved luminous flux and excellent color qualities due to the protrusion part formed by the phosphor according to this exemplary embodiment may be provided.

Meanwhile, a method for manufacturing a phosphor plate according to another exemplary embodiment of the present invention is provided. The method for manufacturing a phosphor plate may include mixing a base plate with a phosphor, compression-molding a mixture of the phosphor and the base plate into a phosphor plate, subjecting the compression-molded phosphor plate to a sintering process, and polishing one side of the phosphor plate so that the phosphor protrudes from the base plate to form a protrusion part which accounts for 20 to 70% of the area of one side of the phosphor plate.

The phosphor according to this exemplary embodiment may be uniformly mixed with a base plate, and then processed to form a phosphor plate. In this case, detailed description of the phosphor and the base plate are as described above, and thus will be omitted for clarity.

For example, when a color temperature of 5,700 K is implemented, the phosphor plate may be formed by 10 to 20 parts by weight of a 550 nm LuAG:Ce (cerium-doped lutetium aluminum garnet) phosphor and 1.0 to 2.0 parts by weight of a nitride (α-SiAlON) phosphor, based on the total weight of the base plate. In this case, the phosphor may have a particle size of 10 µm to 28 µm, based on the particle size distribution (d50). However, this is merely one example, and various changes and modifications may be made to this exemplary embodiment as well.

After the phosphor is mixed with the base plate, a mixture of the phosphor and the base plate may be compression-molded to form a phosphor plate. More specifically, the phosphor plate according to this exemplary embodiment may be formed by putting a mixed powder of the phosphor and the base plate into a mold and compressing the mixed powder.

A molded product of the compression-molded phosphor plate is further subjected to a sintering process. The sintering process according to this exemplary embodiment may be divided into two parts. For example, when a phosphor plate including a glass base as a base plate is formed, primary sintering may be performed at a temperature of 250° C. or less, and secondary sintering may be adjusted depending on a glass transition temperature ($T_g$) of the glass base.

After the sintering process is performed, one side of the phosphor plate according to this exemplary embodiment may be subjected to a polishing process.

As one surface treatment process, the polishing process is a process for polishing one side of the phosphor plate according to this exemplary embodiment with a granule- or powder-type polishing agent to enhance surface flatness and gloss.

In this case, the polishing process according to this exemplary embodiment may be performed so that a thickness of the phosphor plate is in a range of 80 µm to 500 µm. The phosphor may be more easily fixed in the phosphor plate having a thickness of 80 µm or more, thereby ensuring a stable phosphor fixation power. Even when the base plate is subjected to a polishing process after sintering, desirable physical properties may be secured. When the phosphor plate according to this exemplary embodiment has a thickness of 500 µm or less, luminous flux may be improved, and stable color qualities such as color homogeneity may be effectively realized, as described above.

One side of the phosphor plate according to this exemplary embodiment is polished through a polishing process so that the phosphor protrudes from a surface of the base plate to form a protrusion part which accounts for 20% to 70% of the area of the one side of the phosphor plate.

More specifically, the phosphor included in the base plate is formed to protrude from a surface of the phosphor plate while maintaining an original shape of the phosphor without being separated or damaged even when the phosphor is subjected to surface polishing.

In this case, each protrusion part may account for a volume greater than 0 and less than 50%, based on the total volume of the phosphors, each of which forms the protrusion part. When the phosphors forming the protrusion parts may protrude to be exposed to the outside at a volume ratio of 50% or more, the phosphors may be separated or damaged severely.

The recessed part is also formed by the phosphor. In this case, the recessed part may be an empty space formed by separation of the phosphor according to this exemplary embodiment from the base plate. Accordingly, the recessed part according to this exemplary embodiment may account for an area greater than 0 and less than or equal to 5% with respect to the area of one exposed side of the phosphor plate.

According to this exemplary embodiment, the protrusion part formed by the phosphor whose original shape is maintained without being separated or damaged even when the phosphor is subjected to surface polishing accounts for 20 to 70% of the area of the one side of the phosphor plate. In this case, luminous flux or luminous efficiency of the phosphor plate may be improved, and color qualities such as color homogeneity in the phosphor plate may also be improved, as described above. Also, when the ratio of the area of the recessed part formed by the phosphor separated from the base plate is greater than 0 and less than or equal to 5% with respect to the area of the one side of the phosphor plate, a drop in luminous flux caused due to a decrease in the content of the phosphor in the phosphor plate may be prevented, as described above.

In this case, according to this exemplary embodiment, to form a protrusion part without separating or damaging the phosphor from the base plate during a polishing process, one side of the phosphor plate may be polished with a polishing agent having a lower hardness than the phosphor. Of course, even when one side of the phosphor plate is polished with a polishing agent having a lower hardness than the phosphor, the phosphor may be possibly separated or damaged. However, the occurrence frequency of the separation and damage may be remarkably reduced, compared to when one side of the phosphor plate is polished with a polishing agent having a hardness higher than or equal to the hardness of the phosphor. However, the polishing agent should have a higher hardness than the base plate so as to obtain a polishing effect.

The surface roughness according to this exemplary embodiment may vary depending on the size of phosphor particles. For example, when a phosphor having a particle size of 25 µm or less is used, one polished side of the phosphor plate may have a surface roughness of 0.01 to 7 µm even after the phosphor is subjected to a polishing process due to the presence of the protrusion part formed by the phosphor remaining on a surface of the phosphor plate without being polished.

Hereinafter, as one example of the method for manufacturing a phosphor plate according to this exemplary embodiment, when the surface roughness increases 22 fold, the results of measuring a change in luminous flux under the same color coordinates (based on CIE 1931 Chromaticity) are listed in the following Table 1. In this regard, the results of Table 1 below are shown in a graph of FIG. 5.

TABLE 1

| | Luminous flux (lm) | Luminous flux improvement (%) | Cx | Cy | Beam angle |
|---|---|---|---|---|---|
| Conventional phosphor plate | 1204.8 | 100% | 0.3231 | 0.3386 | 122° |
| phosphor plate of this embodiment | 1296.5 | 126% | 0.3223 | 0.338 | 122° |

Results of measurement of luminous flux (n=10, average value)

As listed in the table, it can be seen that, when the surface roughness increased 22 fold, the luminous flux increased by at most 26% under the same color coordinates, and there was no change in beam angle measured using a goniometer.

As described above, according to the method for manufacturing a phosphor plate according to this exemplary embodiment, the phosphor may be preserved since the phosphor is not damaged or separated from the base plate even when the phosphor is subjected to a polishing process. Therefore, since the phosphor may account for 20% or more of the area of one side of the base plate, a method for manufacturing a phosphor plate having improved luminous flux and excellent color qualities may be provided.

The above-described phosphor plate according to exemplary embodiments of the present invention may be combined with a light source element and applied to various lighting devices such as car lighting, indoor lighting, etc. To be implemented as lighting, the above-described phosphor plate is arranged on the light source element. In particular, a surface of the phosphor plate in which the above-described protrusion part is implemented may be arranged on an opposite surface to a side of the phosphor plate adjacent to the light source element. Forming the protrusion part of the phosphor prevents light emitted from the light source element from being back-scattered from the phosphor plate. Therefore, a difference in refractive index through this protrusion structure of the phosphor may be minimized. Light extraction should be maximized through diffused reflection of light. In this case, the protrusion part according to exemplary embodiments of the present invention should account for 20% to 70% of the total surface area of the one side or the other side of the base plate. As a result, such light extraction efficiency may be maximized.

While the specific exemplary embodiments of the present invention have been described and shown herein, it is obvious to a person having ordinary skill in the art that the present invention is not limited to the above-described exemplary embodiments thereof, and various changes and modifications may be made to the exemplary embodiments without departing from the scope of the present invention. Accordingly, it should be understood that such changes and modifications are not intended to be separately construed from the technical scope or viewpoint of the present invention, and modified exemplary embodiments fall within the claims of the present invention.

The invention claimed is:

1. A phosphor plate comprising:
a base plate having one side and another side opposite to the one side thereof;
a phosphor included in the base plate;
wherein a portion of the phosphor is protruded from the one side or the another side of the base plate to be exposed; and
a recessed part formed by separation of the phosphor from a surface of the one side or the another side of the base plate,
wherein a total surface area of the portion of the phosphor protruded from the one side or the another side of the base plate to be exposed accounts for 30% to 70% of a total surface area of the corresponding one side or the another side of the base plate,
wherein the recessed part is configured to account for between 0 and 5% of the total area of the corresponding one side or the another side of the phosphor plate such that a drop in luminous flux caused by a decrease in content of the phosphor in the phosphor plate is inhibited, and
wherein a hardness of the phosphor is higher than a hardness of the base plate.

2. The phosphor plate of claim 1, wherein the phosphor comprises cerium-doped lutetium aluminum garnet (LuAG:Ce) phosphor; and a nitride ($\alpha$-SiAlON) phosphor.

3. The phosphor plate of claim 2, wherein the one side or the an other side of the phosphor plate comprising the protrusion part has a surface roughness of 0.01 μm to 7 μm.

4. The phosphor plate of claim 3, wherein the phosphor has a particle size of 28 μm or less.

5. The phosphor plate of claim 3, wherein a volume of the phosphor protruding outwards from the base plate accounts for greater than 0 and less than 50% of the total volume of the phosphor which forms the protrusion part.

6. The phosphor plate of claim 2, wherein the phosphor plate has a thickness of 80 μm to 500 μm.

7. The phosphor plate of claim 2, wherein the phosphor comprises 1.0 to 2.0 parts by weight of a nitride ($\alpha$-SiAlON) phosphor with respect to 10 to 20 parts by weight of the cerium-doped lutetium aluminum garnet (LuAG:Ce) phosphor.

8. The phosphor plate of claim 7, wherein the phosphor has a particle size of 10 μm to 28 μm.

9. The phosphor plate of claim 2, wherein the base plate is a glass base.

10. The phosphor plate of claim 1, wherein the base plate comprises borate glass.

* * * * *